(12) United States Patent
Govzman et al.

(10) Patent No.: US 6,454,332 B1
(45) Date of Patent: Sep. 24, 2002

(54) APPARATUS AND METHODS FOR HANDLING A SUBSTRATE

(75) Inventors: Boris Govzman, Sunnyvale; Konstantin Volodarsky, San Francisco; Leon Volfovski, Mountain View, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/206,087

(22) Filed: Dec. 4, 1998

(51) Int. Cl.[7] .................. B25J 15/06; B25J 19/02
(52) U.S. Cl. ................. 294/64.1; 294/103.1; 294/907; 414/941
(58) Field of Search ............... 294/1.1, 34, 64.1–64.3, 294/103.1, 119.1, 907; 414/941, 752.1; 901/40, 46

(56) References Cited

U.S. PATENT DOCUMENTS

| | | | |
|---|---|---|---|
| 4,744,713 A | | 5/1988 | Hrovath ................ 414/222 |
| 4,839,961 A | * | 6/1989 | Vermeer ............... 294/119.1 |
| 4,900,214 A | * | 2/1990 | Ben ...................... 294/34 |
| 4,944,650 A | * | 7/1990 | Matsumoto ............ 414/941 |
| 5,100,285 A | * | 3/1992 | Wagner ................ 294/119.1 |
| 5,133,635 A | * | 7/1992 | Malin et al. .......... 414/941 |
| 5,227,708 A | | 7/1993 | Lowrance ............. 318/640 |
| 5,292,222 A | * | 3/1994 | Malagrino, Jr. et al. ... 294/64.1 |
| 5,436,790 A | | 7/1995 | Blake et al. ............ 361/234 |
| 5,513,594 A | | 5/1996 | McClanahan et al. ... 118/503 |
| 5,711,646 A | * | 1/1998 | Ueda et al. ............ 414/941 |
| 5,727,832 A | | 3/1998 | Holter .................. 294/64.1 |
| 5,733,426 A | | 3/1998 | Cox et al. ............. 204/298.01 |
| 5,765,890 A | * | 6/1998 | Gaylord et al. ........ 414/941 |
| 5,961,169 A | * | 10/1999 | Kalenian et al. ...... 294/907 |
| 5,988,971 A | * | 11/1999 | Fossey et al. .......... 414/941 |
| 6,024,393 A | * | 2/2000 | Shamlou et al. ....... 414/941 |
| 6,256,555 B1 | * | 7/2001 | Bacchi et al. ......... 700/245 |

* cited by examiner

Primary Examiner—Dean J. Kramer
(74) Attorney, Agent, or Firm—Robert J. Stern

(57) ABSTRACT

Substrate handling apparatus and methods are described. In one aspect, the substrate handling apparatus includes a clamping member having an extended condition wherein substrate movement relative to the transfer arm is substantially restricted and a retracted condition wherein substrate movement relative to the transfer arm is substantially free. The substrate handling apparatus further includes a sense mechanism (e.g., a vacuum sensor) constructed to determine whether a substrate is properly positioned on the support arm and to trigger the mode of operation of the clamping member between extended and retracted conditions. The sense mechanism also provides information relating to the operating condition of the clamping member.

27 Claims, 5 Drawing Sheets

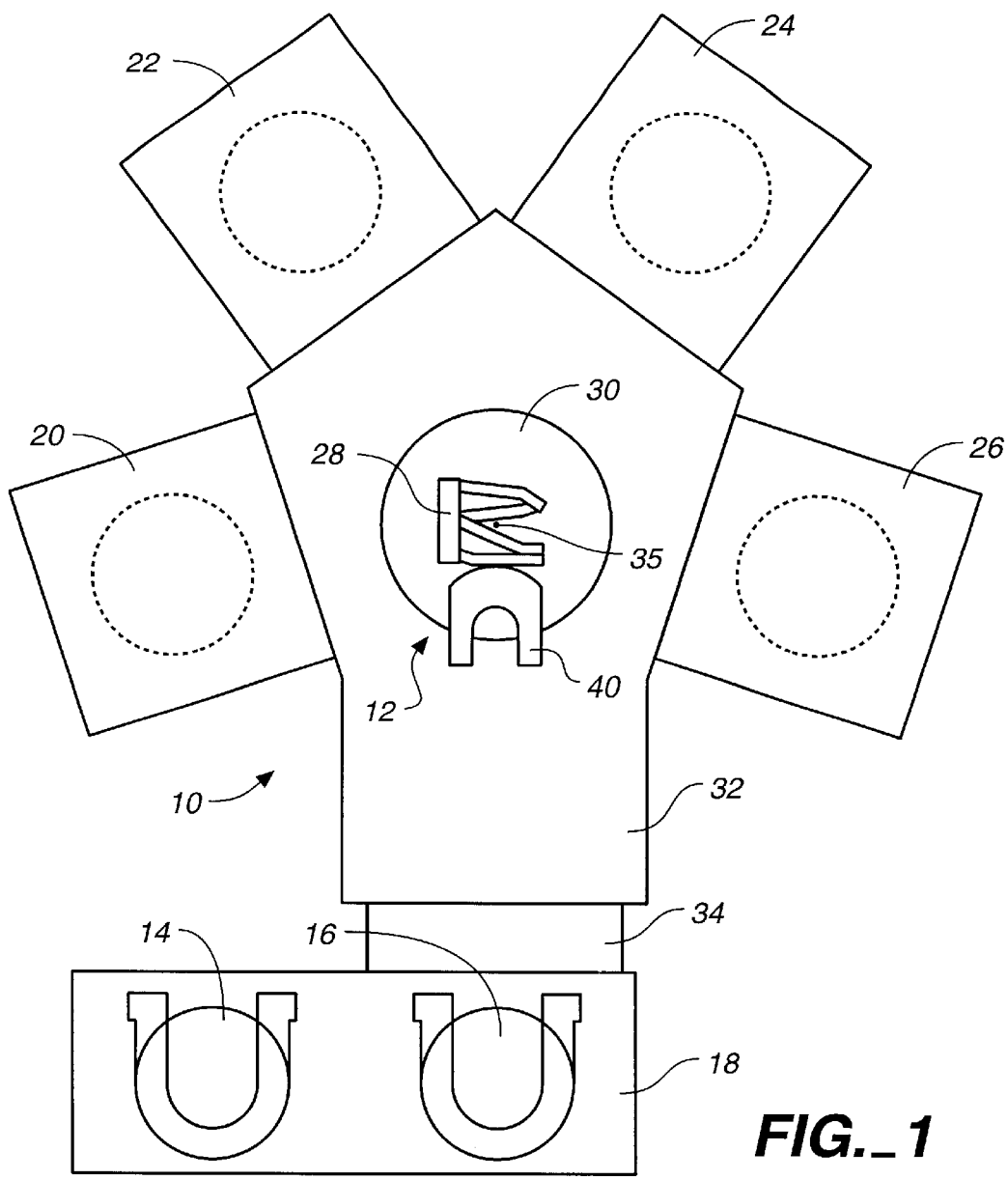
FIG._1

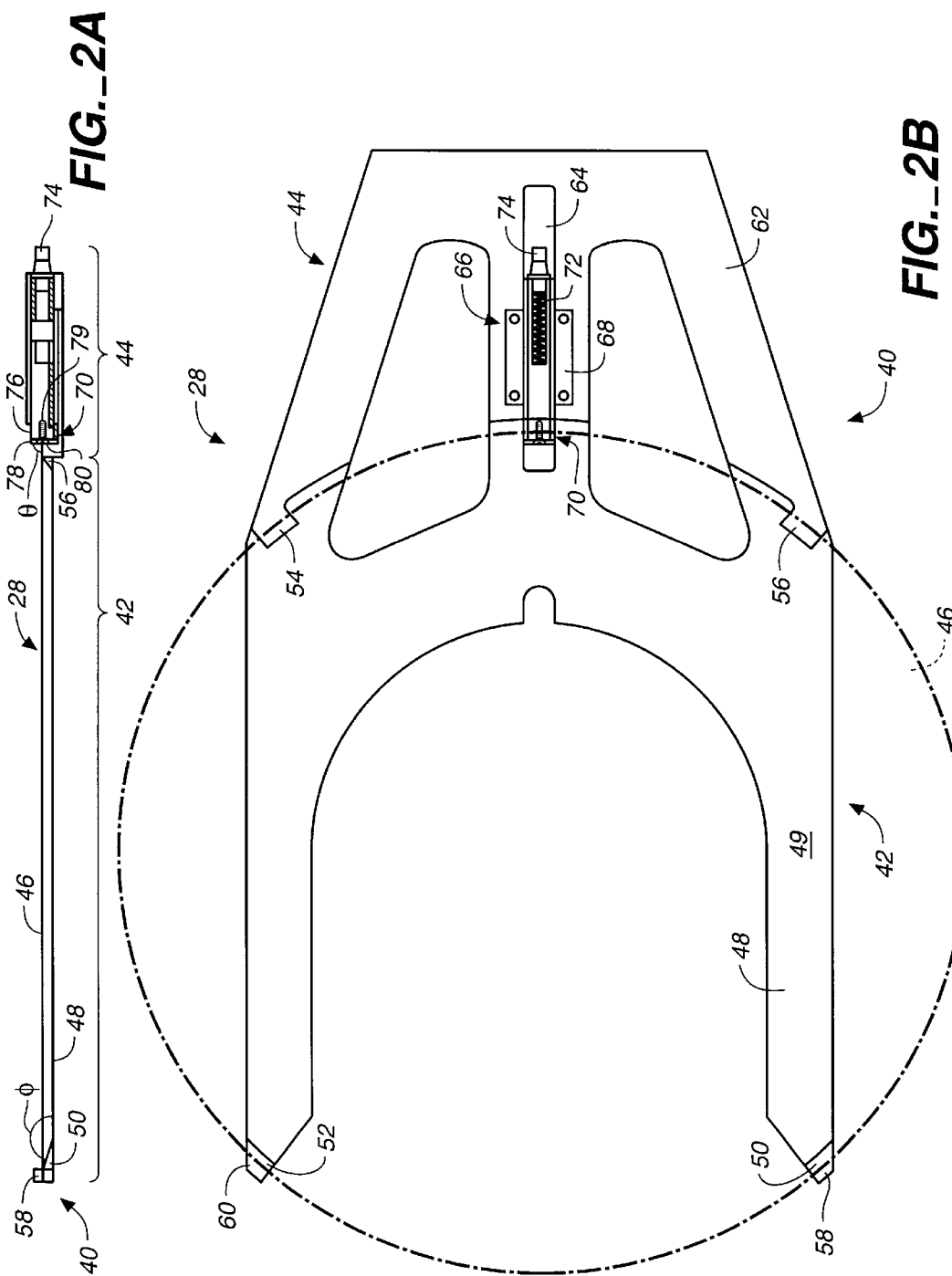

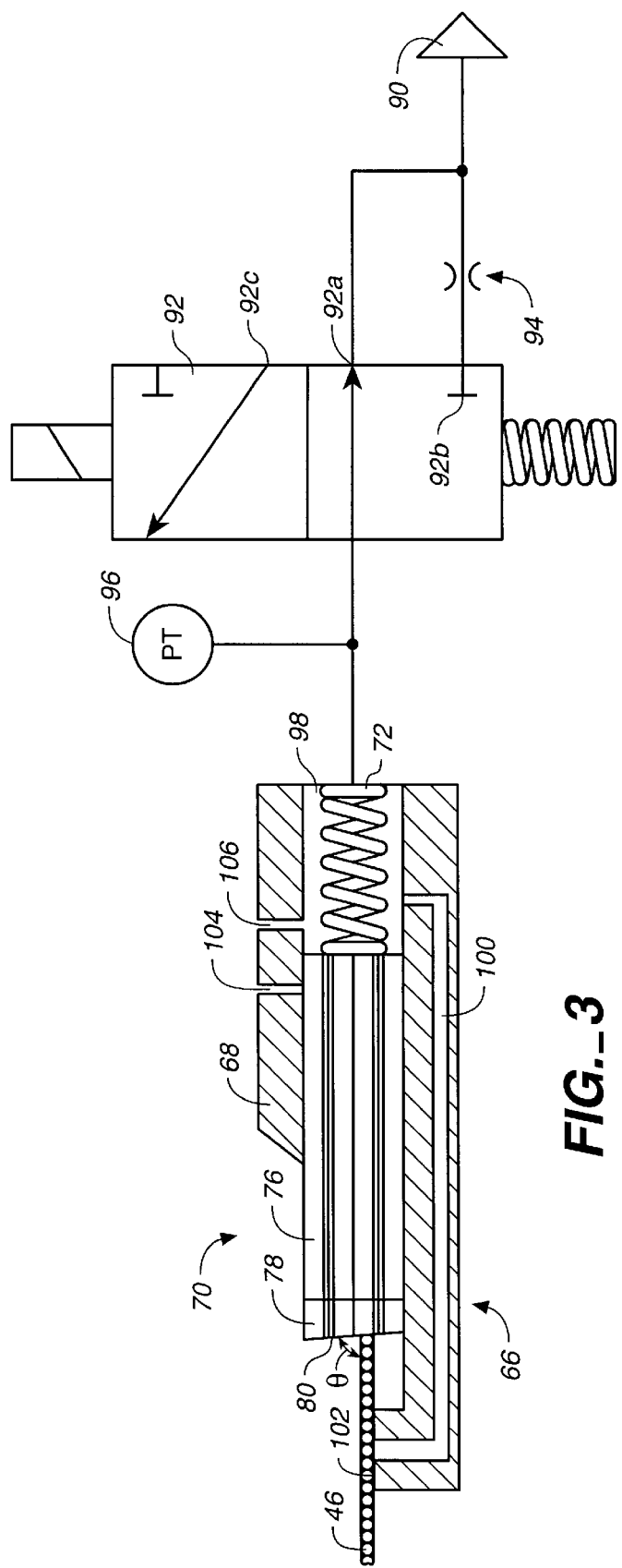
FIG._3

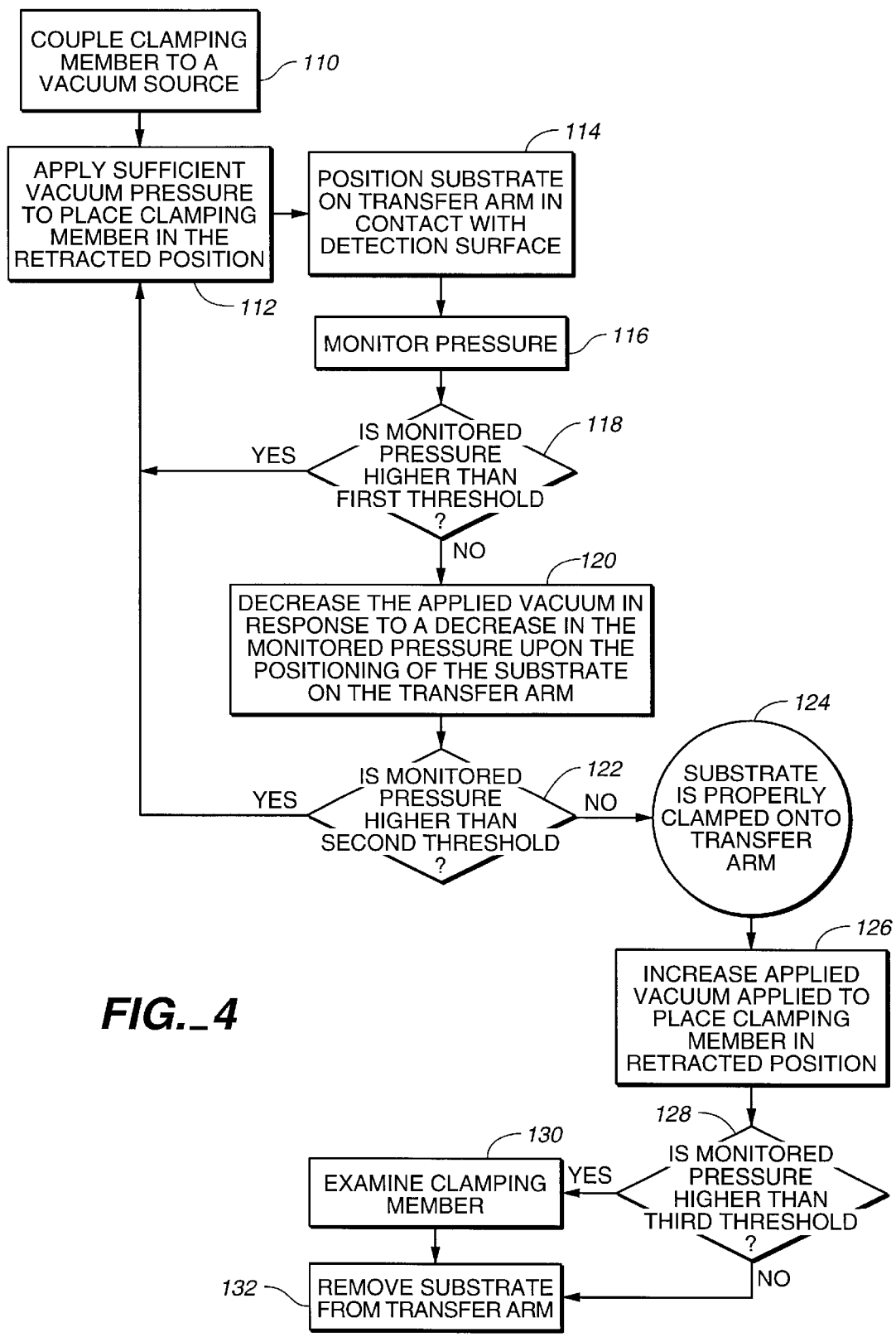
FIG._4

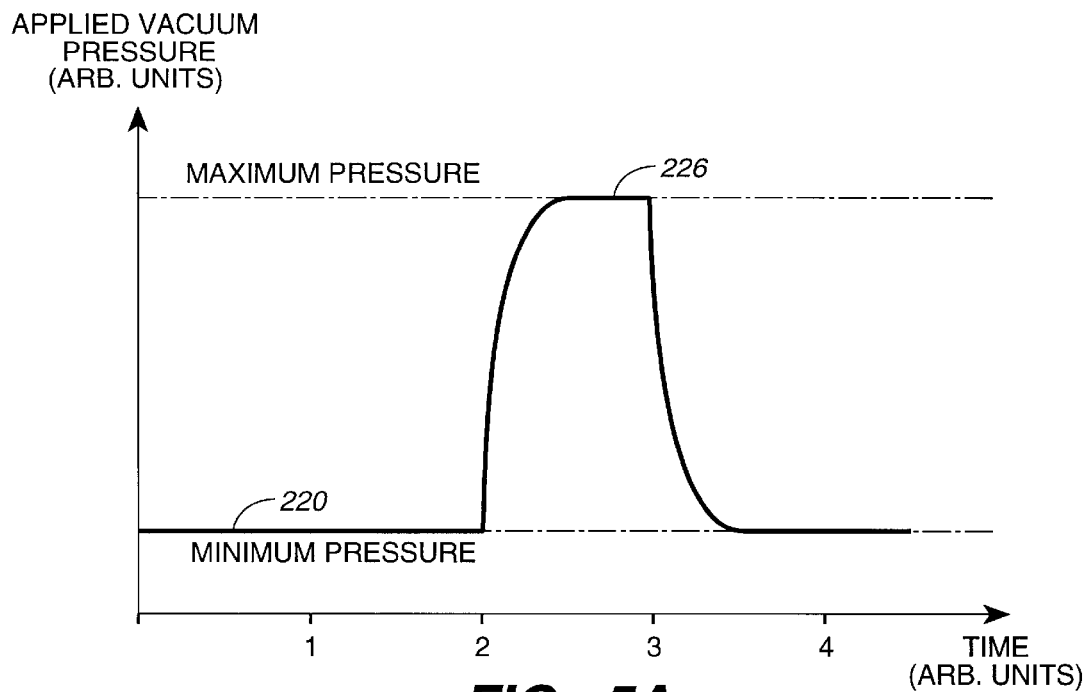
FIG._5A
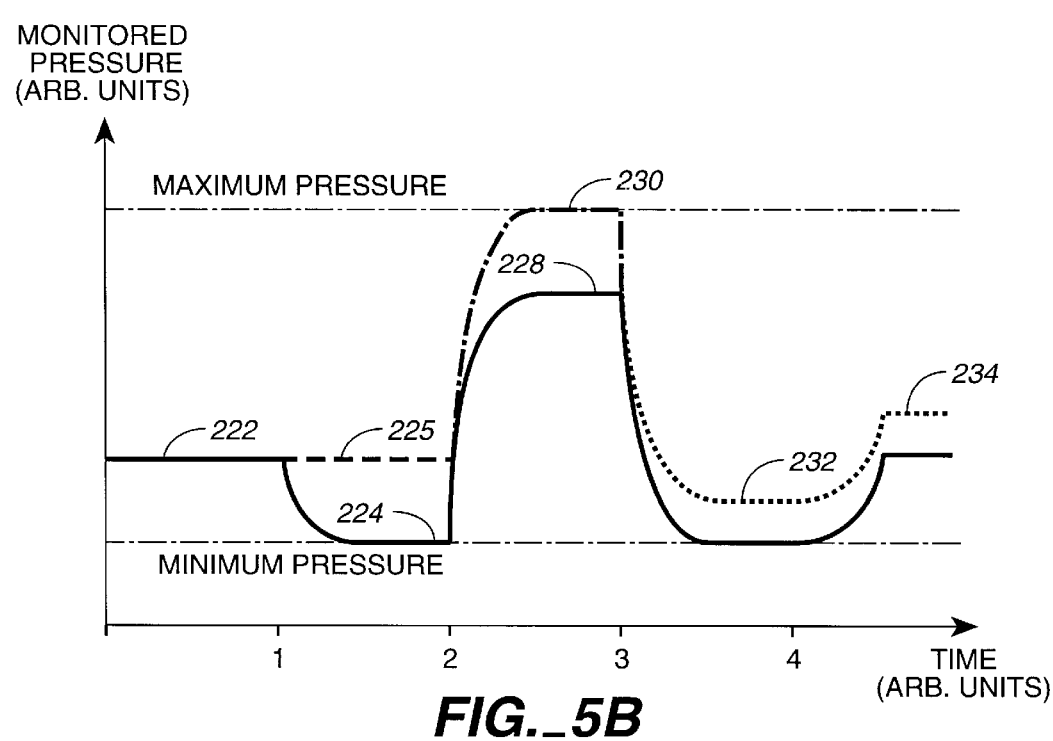
FIG._5B

APPARATUS AND METHODS FOR HANDLING A SUBSTRATE

BACKGROUND OF THE INVENTION

The invention relates to apparatus and methods for handling a substrate.

Apparatus and methods for handling substrates are used in a variety of applications. For example, in semiconductor processing applications, a substrate may be handled by an automated transfer mechanism, such as a transfer robot, which transfers substrates into and out of one or more semiconductor processing stations. Automated transfer mechanisms often include a substrate support in which a substrate may have limited freedom of movement in at least one dimension. Such movement may result in the generation of particles and the misalignment of the substrate with respect to a processing system in which the substrate is placed. Significant substrate misalignment may reduce the number of devices that can be formed on a particular substrate or may cause the substrate to produce particles or even break inside the vacuum chamber. When a substrate breaks inside a vacuum chamber or when a substantial amount of particle contamination has accumulated inside the chamber, the chamber must be opened and exposed to ambient pressure; the chamber must be cleaned; and the chamber must be pumped back down to a sub-ambient pressure suitable for processing. In high vacuum processing applications, such a procedure may take up to twenty-four hours to complete, significantly delaying the time during which the system can be used to process substrates.

SUMMARY OF THE INVENTION

In one aspect, the invention features an apparatus for handling a substrate, comprising: a contact surface constructed to contact the substrate; a sensor constructed to detect contact between the substrate and the contact surface; and a clamping member having an extended condition wherein substrate movement relative to the contact surface is substantially restricted and a retracted condition wherein substrate movement relative to the contact surface is substantially free.

In another aspect, the invention features an apparatus for handling a substrate, comprising: a movable transfer arm having a support surface constructed to carry the substrate; a contact surface coupled to the transfer arm constructed to contact the substrate; and a vacuum sensor constructed to detect contact between the substrate and the contact surface.

The sensor may include a pressure transducer. The contact surface may define a channel opening. A housing defining a channel may be provided to couple the channel opening to a vacuum source. A controller may be provided for operating the clamping member between the extended condition and the retracted condition in response to signals received from the sensor. The contact surface may define a channel opening.

An edge restraint may be provided to contact a first peripheral edge portion of the substrate to limit substrate movement toward the edge restraint. In this embodiment, the extended condition of the clamping member may be characterized by the application of force by the clamping member against a second peripheral edge portion of the substrate urging the first peripheral edge portion of the substrate against the edge restraint. The extended condition of the clamping member may be further characterized by the application of force by the clamping member against the second peripheral edge portion of the substrate urging the substrate against the contact surface. The clamping member may comprise a pusher for contacting the second peripheral edge portion of the substrate, and a biasing member coupled to the pusher for biasing the pusher into the extended condition. The contact surface may be adapted to contact the bottom substrate surface, and the pusher may be adapted to contact only the top substrate surface along the second peripheral edge portion of the substrate.

In yet another aspect, the invention features a substrate handling apparatus comprising: a contact surface constructed to contact the substrate and to define a channel opening; a pusher constructed to contact the substrate; a biasing member having a first end coupled to the pusher and having a second end; and a housing defining a first channel wherein the pusher and the biasing member are disposed, with the second end of the biasing member being coupled to the housing and the pusher being free to move within the first housing channel, the housing further defining a second channel constructed to couple the channel opening to a vacuum source.

The housing may define a third channel through which the first housing channel is exposed to ambient pressure when the pusher extends out of the first housing channel beyond a fixed distance. An edge restraint may be provided for contacting a first peripheral edge portion of the substrate and thereby to limit substrate movement toward the edge restraint, wherein the biasing member biases the pusher against a second peripheral edge portion of the substrate urging the first peripheral edge portion of the substrate against the edge restraint, the third housing channel being closed by the pusher when the substrate is clamped between the edge restraint and the pusher. The housing may define a fourth channel through which the first housing channel is exposed to ambient pressure for determining when the pusher is unable to retract with the first housing channel beyond a fixed distance. The pusher may cut off the second channel from the vacuum source when the pusher is retracted within the first housing channel beyond a fixed distance.

In another aspect of the invention, the substrate handling apparatus comprises: a contact surface constructed to contact the substrate; an edge restraint adapted to contact the first peripheral edge portion of the substrate to limit substrate movement toward the edge restraint; and a clamping member coupled to the contact surface and biased to extend toward the second peripheral edge portion of the substrate thereby to urge the first peripheral edge potion of the substrate against the edge restraint, the clamping member being adapted to retract away from the second peripheral edge portion of the substrate when coupled to an energy source.

The clamping member may be adapted to retract away from the second peripheral edge portion of the substrate when coupled to a vacuum source. The clamping member may be adapted to retract away from the second peripheral edge portion of the substrate when coupled to an energy source independently of the position of the contact surface within a processing environment.

In yet another aspect of the invention, the substrate handling apparatus comprises: a movable transfer arm having a support surface constructed to carry the substrate; an edge restraint adapted to contact a first peripheral edge portion of the substrate to limit substrate movement toward the edge restraint; a contact surface constructed to contact the substrate and to define a channel opening; a pusher constructed to contact a second peripheral edge portion of the substrate; a biasing member having a first end coupled to the pusher and having a second end; and a housing defining a first channel wherein the pusher and the biasing member are disposed, with the second end of the biasing member being coupled to the housing and the pusher being free to move within the first housing channel, the housing further defining a second channel for coupling the channel opening to a vacuum source.

A sensor (e.g., a pressure transducer) may be provided for detecting contact between the substrate and the contact surface. A vacuum source may be coupled to the second housing channel. A flow restrictor may be coupled to the vacuum source, and a valve may be provided for selectively coupling the second housing channel to the vacuum source directly or through the flow restrictor.

In another aspect, the invention features a method of handling a substrate, comprising: providing a transfer arm having a contact surface constructed to contact the substrate and to define a channel opening, the channel opening being coupled to a first channel; coupling the first channel to a vacuum source; monitoring the pressure inside the first channel; and positioning the substrate on the transfer arm in contact with the contact surface.

A clamping member may be coupled to the contact surface and may have an extended condition wherein substrate movement relative to the contact surface is substantially restricted and a retracted condition wherein substrate movement relative to the contact surface is substantially free. Prior to positioning the substrate on the transfer arm, vacuum pressure may be applied to the first channel to place the clamping member in the retracted position. The vacuum applied to the first channel may be decreased in response to a decrease in the monitored first channel pressure upon the positioning of the substrate on the transfer arm, the decrease in applied vacuum being sufficient to place the clamping member in the extended condition. After the applied vacuum is decreased, the substrate may be re-positioned on the transfer arm when the monitored first channel pressure is higher than a predetermined maximum value.

The clamping member that is provided may comprise a second channel through which the first channel is exposed to ambient pressure when the clamping member extends beyond a fixed distance. After the applied vacuum is decreased, the substrate may be re-positioned on the transfer arm when the monitored first channel pressure is higher than a predetermined maximum value. After the applied vacuum is decreased, the vacuum applied to the first channel may be increased to place the clamping member in the retracted position.

The clamping member that is provided may comprise a second channel through which the first channel is exposed to ambient pressure when the clamping member extends beyond a threshold distance. After the applied vacuum is increased, the clamping member may be examined when the monitored first channel pressure is higher than a predetermined minimum value.

In another aspect, the invention features a method of handling a substrate, comprising: providing a transfer arm comprising a clamping member biased to extend toward the substrate and thereby restrain the substrate from moving relative to the transfer arm, the clamping member being adapted to retract away from the substrate when energized; energizing the clamping member sufficiently to retract the clamping member away from the substrate; and after energizing the clamping member, positioning the substrate on the transfer arm.

The clamping member may be energized by coupling the clamping member to a vacuum source. After the substrate is positioned on the transfer arm, the clamping member may be de-energized sufficiently to enable the clamping member to extend toward the substrate and thereby restrain the substrate from moving relative to the transfer arm.

Among the advantages of the invention are the following.

It has been realized that substrate movement relative to the transfer arm during substrate handling can generate particles and can result in substrate misalignment which prevents the substrate from being precisely and reliably positioned inside the processing stations. This problem has been addressed by providing a substrate handling apparatus that includes a clamping member having an extended condition for limiting substrate movement relative to the transfer arm and a retracted condition for freeing substrate movement relative to the transfer arm. The substrate handling apparatus further includes a sense mechanism for determining whether a substrate is properly positioned on the support arm and for triggering the mode of operation of the clamping member between extended and retracted conditions. The sense mechanism also provides information relating to the operating condition of the clamping member.

Other features and advantages will become apparent from the following description, including the drawings and claims.

BRIEF DESCRIPTION OF THE DRAWINGS

FIG. 1 is a diagrammatic top view of a substrate processing system that includes an apparatus for handling a substrate.

FIG. 2A a diagrammatic side view of a transfer head of the substrate handling apparatus shown in FIG. 1.

FIG. 2B is a diagrammatic top view of the transfer head of FIG. 2A.

FIG. 3 is a diagrammatic cross-sectional, side view of a clamping member coupled to a sensor, a three-way valve, and an energizing source.

FIG. 4 is a flow diagram of a method of handling a substrate.

FIG. 5A is a time plot of vacuum pressure applied to a clamping member during the handling of a substrate.

FIG. 5B is a time plot of monitored pressure during the handling of a substrate.

DETAILED DESCRIPTION

Referring to FIG. 1, in one embodiment, a substrate processing system 10 includes a substrate handling apparatus 12 for transferring substrates 14, 16 between a substrate load station 18 and one or more processing stations 20–26. Substrate handling apparatus 12 includes a transfer arm 28 that is mounted on a rotatable table 30 within a transfer chamber 32. In operation, load station 18 is at ambient pressure and each of the processing chambers 20–26 and transfer chamber 32 are maintained at a sub-ambient pressure. A load lock chamber 34 is disposed between transfer chamber 32 and load station 18. Load lock chamber 34 is at ambient pressure when a substrate is being transferred to or from load station 18, and it is at a sub-ambient pressure when a substrate is being transferred between transfer chamber 32 and one or more processing stations 20–26. Transfer arm 28 can rotate about an axis 35 and can extend into and out of load station 18 and processing stations 20–26 to controllably position a substrate into and out of a processing chamber with high accuracy. The position and orientation of transfer arm 28 is recorded and controlled by microprocessor-based controller (not shown).

Referring to FIGS. 2A and 2B, transfer arm 28 includes a transfer head 40 which has a seat portion 42 for receiving a substrate 46 (shown by dashed lines) and a base portion 44. Transfer head 40 may be formed from stainless steel. Seat portion 42 includes a support blade 48, with a substantially planar surface 49 and four support surfaces 50–56, bounded by two edge restraints 58, 60. Support surfaces 50–56 are inclined with respect to planar surface 49 at an angle φ (phi) (FIG. 2A), which preferably has a value of about 135–175 degrees. When properly aligned, substrate 46 is supported on support surfaces 50–56 above planar surface 49 and against edge restraints 58, 60. The backside of substrate 46 remains substantially particle-free and contamination-free because substrate 46 makes only limited contact with transfer head 40.

Base portion 44 of transfer arm 28 includes a flange 62 which has a slot 64 for receiving a clamping member 66, which may be selectively actuated to limit substrate movement relative to transfer arm 28. Clamping member 66 includes a vacuum fitting 74 for coupling to a vacuum source and a housing 68, which is bolted to flange 62 and contains a pusher 70 and a biasing member 72 (e.g., a spring). Housing 68 may be formed from stainless steel. Pusher 70 includes a cylindrical housing 76 and a face plate 78 which is mounted to cylindrical housing 76 by a screw 79. Pusher 70 and face plate 78 may be formed from a TEFLON® (DuPont) resin, a DELRIN® (DuPont) resins, or other material that has a low coefficient of friction. Face plate 78 has a front surface 80 that lies in a plane which is oriented to intersect the top planar surface of the substrate at an angle θ (theta) (FIGS. 2A), and 3 which preferably has a value of about 75 to 85 degrees. With this orientation, front surface 80 contacts the top of the peripheral edge of substrate 46 and thereby applies to substrate 46 a downward force component toward planar surface 49 of support blade 48. This feature tends to prevent pusher 70 from applying to substrate 46 an upward force component that would lift substrate 46 off of the one or more of support surfaces 50–56.

As shown diagrammatically in FIG. 3, clamping member 66 may be coupled to a vacuum source 90 (e.g., a pump) through a three-way valve 92. Valve 92 selectively couples clamping member 66 to vacuum source 90 directly at a port 92a (a high vacuum condition), indirectly through a flow restrictor 94 at a port 92b (a low vacuum condition), or breaks the connection between clamping member 66 and vacuum source 90 at port 92c (no vacuum condition). A sensor 96 (e.g., a pressure transducer) monitors the pressure applied to clamping member 66.

Clamping member housing 68 defines a central channel 98 through which pusher 70 slides back-and-forth. Housing 68 further defines a detection channel 100 which extends from central channel 98 to a contact surface 102 against which substrate 46 makes contact when properly seated on transfer head 40. Housing 68 also includes proximal and distal pusher sensing channels 104, 106, respectively, which extend from central channel 98 to the exterior surface of housing 68. The operation and function of channels 100, 104 and 106 are explained below.

In operation, when three-way valve 92 couples clamping member 66 directly to vacuum source 90, the resulting vacuum produced in central channel 98 is sufficient to overcome the force applied by biasing member 72 and thereby withdraw pusher 70 within central channel 98. In this mode of operation (retracted condition), substrate 46 may be unloaded from or loaded onto transfer head 40. When three-way valve 92 couples clamping member 66 indirectly to vacuum source 90 through flow restrictor 94, the resulting vacuum in central channel 98 is insufficient to overcome the force applied by biasing member 72. In this mode of operation (extended condition), front surface 80 of face plate 78 contacts the top peripheral edge of substrate 46 and urges substrate against edge restraints 58, 60 (FIG. 2B), thereby clamping substrate 46 and limiting substrate movement relative to transfer head 40. Valve 92 is connected at port 92c (no vacuum condition) when vacuum source 90 is turned off.

Referring to FIG. 4, in accordance with one method, a substrate may be handled as follows. Clamping member 66 is coupled to vacuum source 90 (step 110). Sufficient vacuum pressure is applied to place clamping member 66 in the retracted condition (step 112; three-way valve is in the high vacuum position). The substrate is positioned on transfer arm 28 in contact with contact surface 102 (step 114). The pressure is monitored (step 116). If the pressure monitored by sensor 96 is higher than a first threshold (step 118), the substrate is not properly positioned. Sufficient vacuum pressure is then reapplied to place clamping member 66 in the retracted condition (step 112), and the substrate is re-positioned on the transfer arm (step 114). If the monitored pressure is lower than the first threshold, the vacuum pressure is decreased in response to a decrease in the monitored pressure resulting from the fact that channel 100 is closed by the substrate and that channels 104, 106 are closed by pusher 70 (step 120; three-way valve in the low vacuum position). If the monitored pressure is higher than a second threshold (step 122), pusher 70 has missed the substrate and is over-extended. In this case, pusher sensing channels 104 and 106 will be open. Sufficient vacuum pressure is then reapplied to place clamping member 66 in the retracted position (step 112), and the substrate is re-positioned on the transfer arm (step 114). If the monitored pressure is lower than the second threshold (step 122), the substrate is properly clamped onto the transfer arm and the substrate now may be transferred for processing (step 124). After the substrate has been transferred, the substrate may be handled as follows. Sufficient vacuum pressure is applied to place clamping member 66 in the retracted position (step 126). If the monitored pressure is higher than a third threshold (step 128), the clamping member is not fully retracted and pusher sensing channel 106 will remain open. In this situation, pusher 70 should be examined (step 130). If the monitored pressure is lower than the third threshold, the substrate may be removed from transfer arm 28 (step 132).

The vacuum pressure applied and the vacuum pressure monitored during the handling method of FIG. 4 are plotted in FIGS. 5A and 5B, respectively. When clamping member 66 is in the retracted condition (Time 0), the applied pressure drops to a minimum value 220 (FIG. 5A). The monitored pressure, on the other hand, drops to a first intermediate value 222 because detection channel 100 is open as there is no substrate blocking detection channel 100 (FIG. 5B). When a substrate is loaded onto support head 40 and contacts surface 102 (Time 1), detection channel 100 is closed and the monitored pressure drops to a minimum value 224. If the substrate fails to properly contact surface 102 the monitored pressure will remain at intermediate value 222 (shown by dashed line 225). When clamping member 66 is placed in the extended condition (Time 2), the applied pressure rises to a maximum value 226 (FIG. 5A). In this mode of operation, if the substrate is properly clamped, the monitored pressure will rise to a second intermediate value 228 because only pusher sensing channel 106 will remain open. If the substrate is not properly clamped, however, the monitored pressure will increase to a maximum value 130 because pusher 70 would be over-extended (e.g., because substrate 46 has been pushed over edge restraints 58, 60) and detection channel 100 and pusher sensing channels 104, 106 would be all open. To release the substrate (Time 3), clamping member is placed in the retracted condition by reducing the applied pressure to minimum value 220, which is sufficient to overcome the force applied by biasing member 72. If pusher 70 fully retracts within housing 68, pusher sensing channels 104, 106 will be closed and the monitored pressure will drop to the minimum value 224. If, on the other hand, pusher 70 fails to fully retract within housing 68 (e.g., if contamination prevents the pusher from freely moving in central channel 98), the monitored pressure would drop to a third intermediate value 232 because pusher sensing channel 106 would remain open and sensing channel 104 would be closed. When the substrate is unloaded from transfer head 40 (Time 4), the monitored pressure will rise again to first intermediate value 222 because only detection channel 100 will be open. If pusher 70 fails to fully retract, however, the monitored pressure will rise to a fourth intermediate value 234 because both detection channel 100 and pusher sensing channel 106 will remain open.

In the method of FIG. 4, the first and third thresholds are preferably has a value that is slightly greater than the minimum monitored pressure value 224 (FIG. 5B), and the second threshold is preferably has a value that is slightly greater than the second intermediate pressure value 128 (FIG. 5B).

Other embodiments are within the scope of the claims. The principles described above may be used to provide substrate handling systems designed to handle a variety of substrates, such as, semiconductor wafers, rectangular or square glass sheets for flat panel displays, printed circuit boards, or master disks used in the manufacture of compact disks. Such systems can be also designed to handle substrates in a variety of ways. For example, a handling apparatus may be designed to transfer substrates between a load station and one or more processing stations under ambient and sub-ambient conditions, as described above, or may be designed to move substrates within a processing environment.

What is claimed is:

1. An apparatus for handling a substrate, comprising:
    a contact surface having an aperture;
    a pusher having an engaged condition wherein the pusher presses the substrate against the contact surface so that the substrate covers the contact surface aperture and having a disengaged condition wherein the pusher does not press the substrate against the contact surface; and
    a pressure sensor coupled to the contact surface aperture so as to detect whether the contact surface aperture is covered by the substrate, wherein the pressure sensor comprises a pressure transducer.

2. The apparatus of claim 1, further comprising a housing defining a channel constructed to couple the contact surface aperture to a vacuum source.

3. The apparatus of claim 1 further comprising:
    at least one edge restraint;
    wherein, in the engaged condition of the pusher, the pusher presses against a first peripheral edge portion of the substrate so as to urge a second peripheral edge portion of the substrate against the at least one edge restraint.

4. The apparatus of claim 1 wherein:
    the pusher includes a body and a face, wherein the face of the pusher is adapted to contact a peripheral edge portion of the substrate;
    a biasing member having a first end coupled to the pusher and having a second end; and
    a housing defining a first channel within which the body of the pusher and the biasing member are disposed, with the second end of the biasing member being coupled to the housing, and the body of the pusher being movable within the first channel, the housing further defining a second channel constructed to couple the contact surface aperture to a vacuum source.

5. The apparatus of claim 1, wherein, when the pusher is in said engaged condition, the contact surface abuts a rear surface of the substrate.

6. An apparatus for handling a substrate, comprising:
    (a) at least one support surface adapted to support the substrate at a substrate support position;
    (b) a pusher having a body and a face the face being adapted to contact the substrate;
    (c) a housing having a first channel within which the body of the pusher is disposed, the body of the pusher being movable within the first housing channel; and
    (d) a vacuum source coupled to the first channel;
    (e) wherein the housing includes a second channel having an aperture through which the second channel communicates with the first channel, wherein the second channel is coupled to ambient pressure; and
    (f) wherein the aperture of the second channel is positioned within the first channel so that:
        (i) when the face of the pusher is in contact with the substrate at said substrate support position, the body of the pusher covers the aperture, and
        (ii) when the face of the pusher enters said substrate support position in the absence of a substrate at said substrate support position, the body of the pusher does not cover the aperture so that the first housing channel is exposed to ambient pressure.

7. The apparatus of claim 6 further comprising:
    an edge restraint adapted to contact a first peripheral edge portion of the substrate to limit substrate movement toward the edge restraint; and
    a biasing member coupled to the pusher so as to press the pusher against a second peripheral edge portion of the substrate and press the first peripheral edge portion of the substrate against the edge restraint, the aperture of the second housing channel being covered by the pusher when the substrate is pressed between the edge restraint and the pusher.

8. The apparatus of claim 6 wherein:
    the body of the pusher is movable between a retracted position and an extended position within the first channel, wherein the pusher is in the extended position when the face of the pusher contacts the substrate;
    the housing includes a second channel having an aperture through which the second channel communicates with the first channel;
    the second channel is coupled to ambient pressure; and
    the aperture of the second channel is positioned within the first channel so that the body of the pusher covers the aperture of the second channel only when the pusher is positioned substantially at the retracted position and so that the first housing channel is exposed to ambient pressure when the pusher is unable to completely retract within the first housing channel.

9. The apparatus of claim 6, further comprising:
a pressure sensor coupled to the first channel so as to sense an increase in pressure within the first channel when the pusher enters said substrate support position in the absence of a substrate at said substrate support position.

10. An apparatus for handling a substrate comprising:
at least one support surface adapted to support the substrate at a substrate support position;
a pusher having a body and a face, the face being adapted to contact the substrate;
a housing having a first channel within which the body of the pusher is disposed, the body of the pusher being movable within the first housing channel;
a vacuum source coupled to the first channel;
a contact surface having an aperture that is covered by the substrate when the substrate is in the substrate support position; and
a second channel extending from the aperture of the contact surface to an aperture of the first channel;
wherein the pusher covers the aperture of the first channel so as to obstruct the second channel from communication with the vacuum source when the pusher is retracted within the first housing channel beyond a threshold distance.

11. An apparatus for handling a substrate comprising:
a movable transfer arm having an edge restraint adapted to contact a first peripheral edge portion of a substrate to limit substrate movement toward the edge restraint;
a pusher having a face and a body, the face being adapted to contact a second peripheral edge portion of the substrate;
a housing defining a channel within which the body of the pusher is disposed, with the body of the pusher being movable within the channel;
a biasing member coupled to the pusher so as to urge the body of the pusher to extend outward from the channel; and
a vacuum source coupled to the channel so as to urge the body of the pusher to retract into the channel;
a flow restrictor coupled to the vacuum source; and
a valve connected to selectively couple the housing channel to the vacuum source directly or through the flow restrictor.

12. A method of transferring a substrate, comprising the steps of:
providing a movable transfer arm comprising
a pusher, and
a contact surface having an aperture;
providing a first channel coupling the contact surface aperture to a vacuum source;
monitoring the pressure inside the first channel; and
said pusher pressing a substrate against the contact surface so that the substrate covers the contact surface aperture.

13. A method of holding a substrate, comprising the steps of:
providing a substrate support apparatus comprising (i) a substrate support area, (ii) a substrate contact surface having an aperture arranged so as to be covered by a substrate positioned at the substrate support area, (iii) a first channel coupled to said aperture in the contact surface, and (iv) a pusher having a face and a body;
movably mounting the body of the pusher within the first channel;
applying to the pusher a bias force directed so as to urge the pusher toward the substrate support area;
applying sufficient vacuum to the first channel to retract the pusher away from the substrate support area;
monitoring the pressure within the first channel;
positioning the substrate on the substrate support area of the transfer arm; and
decreasing the vacuum applied to the first channel in response to a decrease in the monitored first channel pressure upon the positioning of the substrate on the transfer arm, the decrease in applied vacuum being sufficient to permit the bias force to press the pusher against the substrate.

14. A method of claim 13 further comprising
after the step of decreasing the applied vacuum, re-positioning the substrate on the transfer arm when the monitored first channel presure is higher than a predetermined maximum value.

15. The method of claim 13, further comprising the step of:
after the step of decreasing the applied vacuum, increasing the vacuum applied to the first channel so as to retract the pusher.

16. A method of monitoring the position of a substrate pusher, comprising the steps of:
providing a movable transfer arm comprising (i) a first channel, (ii) a second channel having an aperture through which the second channel communicates with the first channel, and (iii) a pusher having a body and a face adapted to abut the perimeter of a substrate;
movably mounting the body of the pusher within the first channel;
coupling the second channel to ambient pressure;
applying sufficient vacuum to the first channel to retract the pusher away from the substrate support area; and
monitoring the pressure within the first channel;
wherein the aperture of the second channel is positioned within the first channel so that the body of the pusher covers the aperture of the second channel only when the body of the pusher is retracted substantially completely within the first channel and so that the first channel is exposed to ambient pressure when the body of the pusher is unable to completely retract within the first channel in response to the vacuum of the applying step.

17. A method of transferring a substrate, comprising the steps of:
providing a movable transfer arm comprising (i) a substrate support area, (ii) a first channel, (iii) a second channel having an aperture through which the second channel communicates with the first channel, and (iv) a pusher having a face and a body;
movably mounting the body of the pusher within the first channel;
coupling the second channel to ambient pressure;
applying sufficient vacuum to the first channel to retract the pusher away from the substrate support area;
positioning the substrate on the substrate support area of the transfer arm;
monitoring the pressure within the first channel; and wherein the aperture of the second channel is positioned within the first channel so that
when the face of the pusher is in contact with the substrate at said substrate support position, the body of the pusher covers the aperture, and
when the face of the pusher enters said substrate support position in the absence of a substrate at said substrate support position, the body of the pusher does not cover the aperture so that the first channel is exposed to ambient pressure.

18. An apparatus for handling a substrate having a front surface and a rear surface bounded by a peripheral edge, comprising:
a transfer head including at least one edge restraint member and a contact surface adapted to receive a substrate; and
a pusher that is movably mounted to the transfer head, the pusher having a front surface, and the pusher being movable between a disengaged condition and an engaged condition, wherein, in the engaged condition; the front surface of the pusher presses against a first portion of the peripheral edge of the substrate so that a second portion of the peripheral edge of the substrate presses against the at least one edge restraint;
wherein, when the pusher is in its engaged condition, the front surface of the pusher is oriented at an acute angle relative to the front surface of the substrate.

19. The apparatus of claim 18, wherein said acute angle is 75 to 85 degrees.

20. The apparatus of claim 18, further comprising a sensor, coupled to the contact surface, for detecting whether the substrate is pressing against the contact surface.

21. An apparatus for handling a substrate, comprising:
a movable transfer arm including
a contact surface having an aperture, and
at least one support surface positioned so as to support a substrate so that the substrate covers the contact surface aperture;
a housing defining a channel that extends from the contact surface aperture to a vacuum source; and
a pressure sensor coupled to the contact surface aperture;
wherein the vacuum source and pressure sensor are directly coupled to the contact surface aperture so that the pressure sensor senses a decrease in pressure when the substrate covers the contact surface aperture and senses an increase in pressure when the substrate does not cover the contact surface aperture.

22. The apparatus of claim 21, further comprising:
a pusher movable between a retracted position and an extended position; and
a vacuum control valve coupled between the vacuum source and the pusher;
wherein, in response to the pressure sensor sensing a decrease in pressure, the valve couples a first level of vacuum from the vacuum source to the pusher so as to extend the pusher to abut the substrate; and
wherein, in response to the pressure sensor sensing an increase in pressure, the valve couples a second level of vacuum from the vacuum source to the pusher so as to retract the pusher.

23. An apparatus for handling a substrate having a front surface and a rear surface bounded by a peripheral edge comprising:
a transfer head including at least one edge restraint member and a contact surface;
a pusher that is movably mounted to the transfer head, the pusher being movable between a disengaged condition and an engaged condition wherein
in the didengaged condition, the pusher does not press against the substrate, and
in the engaged condition; the pusher presses against a first portion of the peripheral edge of the substrate so that a second portion of the peripheral edge presses against the at least one edge restraint; and
a vacuum source for supplying a controllable level of vacuum to the pusher, wherein the vacuum source controllably supplies either a first level or a second level of vacuum to the pusher;
wherein the vacuum source is coupled to the pusher so as to move the pusher into the disengaged condition in response to said first level of vacuum and into the engaged condition in response to said second level of vacuum.

24. The apparatus of claim 23, further comprising:
a housing defining a channel within which the body of the pusher is disposed, the body of the pusher being movable within the channel;
wherein the channel is connected to the vacuum source so as to couple the vacuum source to the pusher.

25. The apparatus of claim 24, wherein the vacuum source further comprises:
a valve for controlling the level of vacuum coupled to the channel from the vacuum source;
wherein the valve controllably provides to the channel a level of vacuum ranging between said first level and said second level.

26. The apparatus of claim 25 wherein, when the valve provides said first level of vacuum to the channel, the pusher extends outward from the channel sufficiently for the face of the pusher to press against the second peripheral edge portion of the substrate so that the first peripheral edge portion of the substrate presses against the edge restraint.

27. Apparatus for monitoring the position of a substrate pusher, comprising:
a transfer head adapted to support a substrate;
a housing attached to the transfer head, wherein the housing has a first channel;
a pusher mounted so as to be movable within the first channel between a retracted position and an extended position; and
a pressure sensor for monitoring the pressure within the first channel;
wherein the first channel includes a first aperture coupled to ambient pressure; and
wherein the second aperture is positioned so that the pusher covers the second aperture only when the pusher is retracted substantially completely and so that the second aperture exposes the first channel to ambient pressure when the pusher is not retracted substantially completely.

* * * * *